(12) United States Patent
Tiwari

(10) Patent No.: US 7,185,239 B2
(45) Date of Patent: Feb. 27, 2007

(54) ON-CHIP TIMING CHARACTERIZER

(75) Inventor: Naveen Tiwari, Delhi (IN)

(73) Assignee: STMicroelectronics Pvt. Ltd., Uttar Pradesh (IN)

(*) Notice: Subject to any disclaimer, the term of this patent is extended or adjusted under 35 U.S.C. 154(b) by 98 days.

(21) Appl. No.: 10/953,896

(22) Filed: Sep. 29, 2004

(65) Prior Publication Data
US 2005/0149778 A1 Jul. 7, 2005

(30) Foreign Application Priority Data
Sep. 29, 2003 (IN) .................. 1214/DEL/2003

(51) Int. Cl.
G11B 20/20 (2006.01)
G06F 11/00 (2006.01)

(52) U.S. Cl. ..................... 714/700; 714/798
(58) Field of Classification Search ............. 714/700, 714/798
See application file for complete search history.

(56) References Cited

U.S. PATENT DOCUMENTS

| 4,504,749 | A | * | 3/1985 | Yoshida | 327/276 |
|---|---|---|---|---|---|
| 5,544,175 | A | | 8/1996 | Posse | 371/25.1 |
| 5,787,092 | A | * | 7/1998 | Jaynes et al. | 714/724 |
| 6,115,836 | A | * | 9/2000 | Churchill et al. | 714/726 |
| 6,462,998 | B1 | * | 10/2002 | Proebsting | 365/205 |
| 6,479,983 | B1 | * | 11/2002 | Ebiya | 324/158.1 |
| 6,622,103 | B1 | * | 9/2003 | Miller | 702/89 |
| 6,912,665 | B2 | * | 6/2005 | Ellis et al. | 713/401 |
| 6,990,613 | B2 | * | 1/2006 | Doi et al. | 714/700 |
| 7,010,729 | B2 | * | 3/2006 | Doi et al. | 714/700 |

* cited by examiner

Primary Examiner—Cynthia Britt
(74) Attorney, Agent, or Firm—Lisa K. Jorgenson; Robert Iannucci; Seed IP Law Group PLLC

(57) ABSTRACT

An on-chip timing measurement circuit for improving skew measurement and timing parameter characterization in integrated logic circuits providing increased accuracy and range. The measurement circuit includes a chip delay element characterization circuit for determining chip specific delay values having one output connected to a second control input of the programmable delay generator and receiving an output from the programmable delay generator for providing a value corresponding to the measured chip specific delay element timing, the characterization circuit being enabled by a control signal from the analyzer during a setup phase of the measurement cycle thereby enhancing the accuracy of the measurement for both skew measurement and timing parameter characterization.

20 Claims, 7 Drawing Sheets

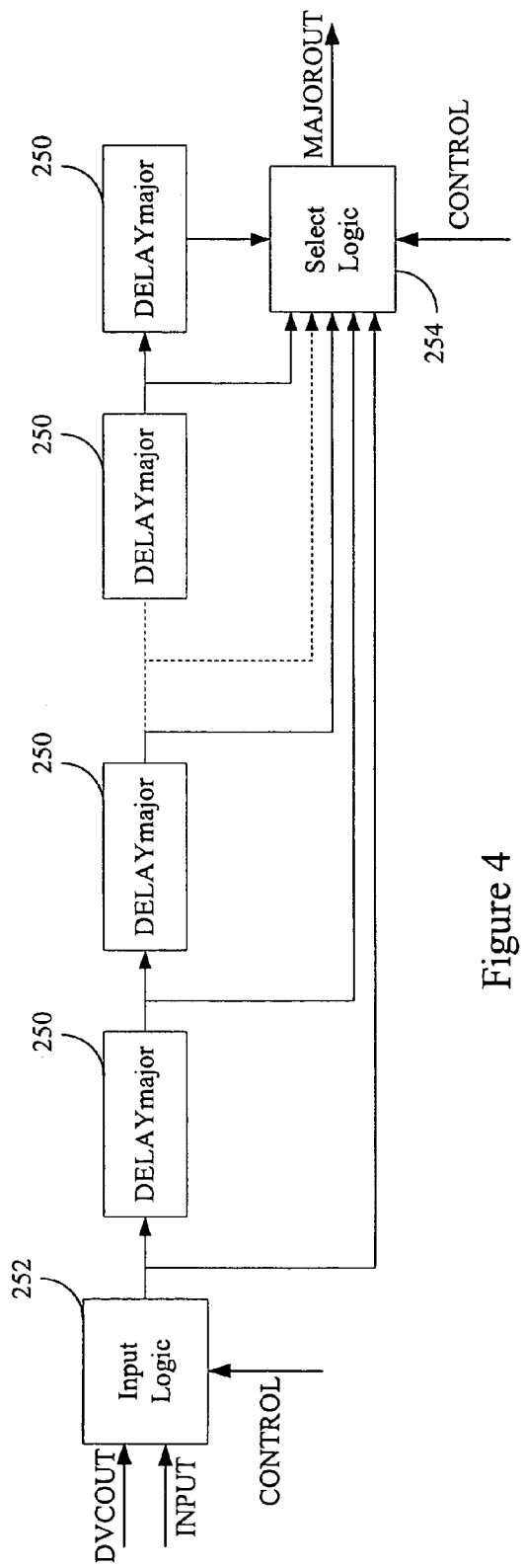
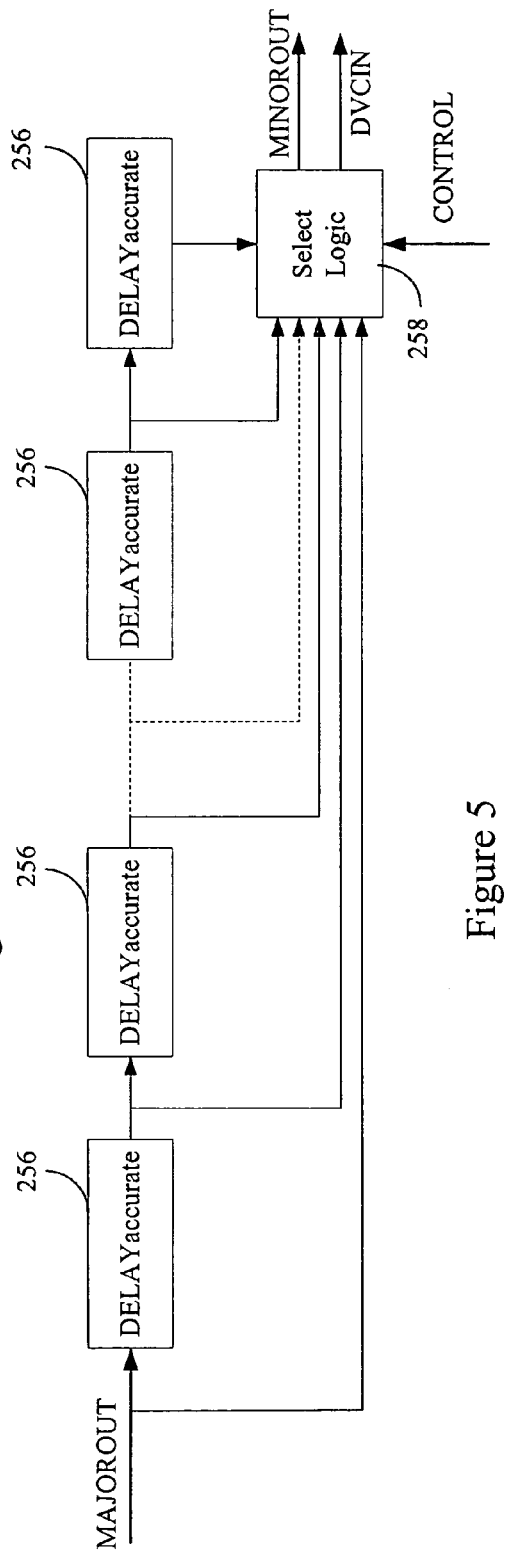
Figure 4
Figure 5

ON-CHIP TIMING CHARACTERIZER

BACKGROUND OF THE INVENTION

1. Field of the Invention

The invention relates to Integrated Circuits, more particularly it relates to a method a device for On-Chip timing characterization of Integrated Circuits (ICs).

2. Description of the Related Art

The setup time of any circuit is the minimum time between one reference signal (clock or gate or any such signal) and other reference signal (data or address) that produces the desired output i.e., there is no functionality failure.

Any chip characterization involves timing measurements. With shrinking technology the timings that are to be measured are also shrinking. Conventionally an external tester at Input/Output (IO) pad level measures the setup timings of ICs. In this case the timings generated by the tester are applied at the IO pads of the embedded macro whose setup timing are to be characterized. Such measurements using separate testing devices are difficult because signal communication from one device to other, itself adds larger noise than the order measurements. Also with this type of testing it is not possible to characterize the setup of a whole data bus accurately as skews can change till reaching the actual block, thus worst-case failure is not checked.

To characterize the timings on the order of picoseconds, the off-chip methods for timing characterization provide ambiguous results, since the delays in the tester are significant to attribute errors in the measurements. Further the methods and devices proposed so far use full custom components or some calibration with respect to the tester. It is important to note that no matter how well the operating and manufacturing conditions are matched, it is impossible to make two identical ICs, hence to calibrate or characterize two different ICs with a custom component on a same scale results in the inaccurate measurements. Therefore it is required to know the delay parameters of individual ICs before they are characterized. Also the temperature and operating voltages affect ICs in different manners, which changes the internal setup time accordingly. Therefore, it is important to account for such conditions while the ICs are being characterized. The present arts do not take this effect into account.

U.S. Pat. No. 5,544,175 provides a method and device in which the delay is provided as a multiple of time increments dT. This incrementing process is Voltage and temperature dependent and also varies chip to chip. Thus for every different condition dT needs to be known. Also, the delay's on-chip value at that particular conditions is also not available. It uses a clock signal as reference to store the status of signals so this results in error of 2*dT when comparing values of 2 signals. The methodology only sees the state of signals and is not able to determine the input constraints of timings of 2 signals or between a signal and bus and uses preprogrammed base delay to calibrate the delay attributable to tester components (column 6). It uses comparators which may be avoided for timing faults measurement.

U.S. Pat. No. 5,787,092 describes a method to measure path delay by changing the clock frequency supplied by a tester which has limitations in terms of accuracy and range. The accuracy in the method is dependent on clock accuracy.

In the U.S. Pat. No. 6,462,998 the delays are made independent of voltage variations by using a regulated voltage supply for voltage and temperature variations. It also uses a voltage controlled delay line that requires careful designing and larger cycle time. This method also uses many full custom components which need to be designed hence requires time and efforts.

In some cases designers have to rely on the value of setup time characterized by Computer Aided Design (CAD) after adding tolerable margins that limit the operating frequency to a value beyond which the circuit can operate successfully, therefore limits the speed of the circuit.

Thus it has been observed that there are needs to develop an on-chip technique that can overcome the above limitations.

BRIEF SUMMARY OF THE INVENTION

An embodiment of the invention obviates the above and other drawbacks associated with the prior art.

One embodiment of the invention provides a method and device for on-chip timing characterization of the ICs over a range of voltages and temperatures. The method and device also increase the accuracy and provide timings in digital format. The method and device also enable timing characterization for multiple bit buses. The method and device also provide realistic timing values measured on silicon, a skew balancing and/or skew insertion for on-chip silicon testing and debugging, both high range and high accuracy, and reduced testing timing.

One embodiment of the present invention provides an on-chip timing measurement circuit for improving skew measurement and timing parameter characterization in integrated logic circuits providing increased accuracy and range. The circuit includes:

a programmable delay circuit receiving a first signal at its input and providing a delayed output of the signal, an output of said programmable delay circuit being connected to one input of a circuit under test in the case of timing parameter characterization, whereas the output is connected to one input of a timing analyzer in case of skew measurement;

a second input signal connected to second input of the circuit under test in case of timing parameter characterization whereas the second input connected to another input of the analyzer in case of skew measurement, one output of the analyzer connected to the control input of the programmable delay generator for controlling the delay value, a second output of the analyzer providing the result of the skew measurement/timing parameter characterization; and a chip delay element characterization circuit for determining chip specific delay values having one output connected to a second control input of the programmable delay generator and receiving an output from the programmable delay generator for providing a value corresponding to the measured chip specific delay element timing, the characterization circuit being enabled by a control signal from the analyzer during a setup phase of the measurement cycle thereby enhancing the accuracy of the measurement for both skew measurement and timing parameter characterization.

The programmable delay circuit comprises a major scale delay circuit having a chain of delay elements each providing a circuit delay value connected to the input of an accurate scale delay circuit having a chain of delay elements each providing a fractional unit delay value having its output connected to an output logic circuit so as to provide a wide range of delay values and a programmable output signal polarity.

The delay element characterization circuit comprises a logic circuit for configuring the interconnector and the delay elements of the Programmable Delay Generator to form a ring oscillator so as to derive the unit delay value from the resultant oscillation frequency The analyzer is a logic circuit that compares the output of the CUT with an expected output in the case of timing parameter characterization whereas it compares the input signal transitions in the case of skew measurement.

Another embodiment of the invention provides an improved on-chip method for measuring skew and timing characteristics of integrated circuits providing increased accuracy and range. The method includes the steps of:
  providing a programmable delay to a first signal,
  connecting the delayed signal to one input of a circuit under test in the case of timing parameter characterization, whereas connecting it to one input of a timing analyzer in case of skew measurement,
  supplying a second input signal to a second input of said circuit under test in case of timing parameter characterization whereas supplying the second input to a second input of the analyzer in case of skew measurement,
  automatically adjusting the delay from the programmable delay generator using one output of the analyzer,
  receiving a result of the skew measurement/timing parameter characterization from a second output of the analyzer,
  characterizing chip specific delays by connecting the chain of delay elements of that provides the programmable delay as a ring counter and deriving the unit delay value from the resultant oscillation frequency, during a setup phase of the measurement cycle thereby enhancing the accuracy of the measurement for both skew measurement and timing parameter characterization.

The delaying of the signal in programmable delay circuit comprises the steps of:
  providing a major scale delay circuit having of a chain of delay elements for delaying signal by a first delay value;
  providing an accurate scale delay circuit having a chain of delay elements for delaying the signal by a second delay value that is a fractional part of the unit delay value of said first delay value for providing a wide range of delay values and a programmable output signal plurality.

BRIEF DESCRIPTION OF THE SEVERAL VIEWS OF THE DRAWINGS

The invention will now be described with reference to the accompanying drawings.

FIG. 4 shows a diagram of a programmable major scale.

FIG. 5 shows a diagram of a programmable accurate scale.

DETAILED DESCRIPTION OF THE INVENTION

The present invention allows on-chip timing measurements with high accuracy over a range of voltages and temperature. One embodiment of the present invention uses a delay value characterizer to allow measurements at different voltages and temperature on silicon. The measurements of similar circuits on different chips are also measurable. The timings that can also be measured include skew measurement, input timing constraint measurement like setup time, hold time, recovery time, removal time etc. To measure timings basically two configurations are used. The first configuration will act as on-chip skew characterizer. The second configuration will act as on-chip input constraint characterizer by varying the skew value of a first reference signal (clock or gate or any such signal) from a relaxed value to a minimum time and allowing another reference signal (data or address) to make transition at known times till failure occurs.

Figure 1:
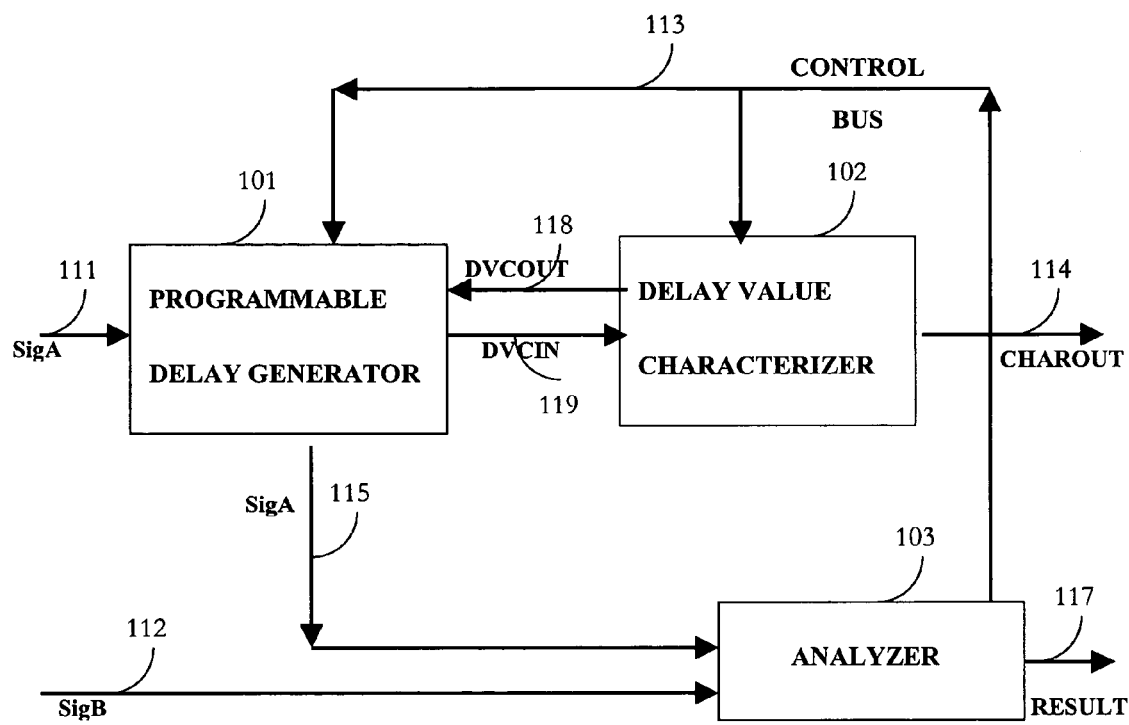
FIG. 1 shows a block diagram of an on-chip skew characterizer.

FIG. 1 shows an on-chip input skew characterizer in accordance with one embodiment of the present invention. For on chip timing characterization, the characterizer includes a programmable delay generator 101 connected to a delay value characterizer 102 and an analyzer 103 having a first input that receives one input signal from said programmable delay generator and provides an output. This configuration is used for skew measurement between two signals namely SigAIN 111 and SigB 112.

In one embodiment, the analyzer is synthesized from a resistor-transistor logic (RTL) circuit depending on the application targeted. For skew characterization it increases the skew of a signal coming earlier up to a point when both of the signals SigA and SigB converge. For input constraint characterization it must decrease the skew from maximum skew to a point when the functionality of circuit under test fails. Other algorithms of the analyzer 103 may be considered as simple applications of the method. The analyzer 103 can be designed using other algorithms also like a binary search algorithm where the number of iterations will be reduced. The binary search algorithm is described using FIG. 7 in a later part of the description.

In one phase, the SigAIN 111 is fed into programmable delay generator 101 which delays SigAIN 111 depending on the value of a control bus 113 to produce a delayed output SigA 115. For the purpose of describing the invention one can assume that the SigAIN 111 is occurring earlier than SigB 112. The analyzer 103 compares the occurrence of transition of SigA 115 and SigB 112 and reports a RESULT 117 whenever the two transitions occur simultaneously. This value is used for calculating the total skew between SigAIN 111 and SigB 112. In the second phase the analyzer 103 changes the value of the control bus 113 so as to start the self-characterization mode. The delay value characterizer 102 is activated by the control bus 113 and it uses DVCIN 119 and produces DVCOUT 118 to form a delay loop chain along with programmable delay generator 101 and starts oscillating. The delay value characterizer includes an output that presents an output signal CHAROUT 114 that is observed at a tester output and its frequency is noted down.

The final result is calculated by using the values of both phases with the formula as explained later. These two phases are repeated for each operating condition of temperature and voltage and also for every chip as the delays for each operating condition and for each chip will be different.

Figure 2:
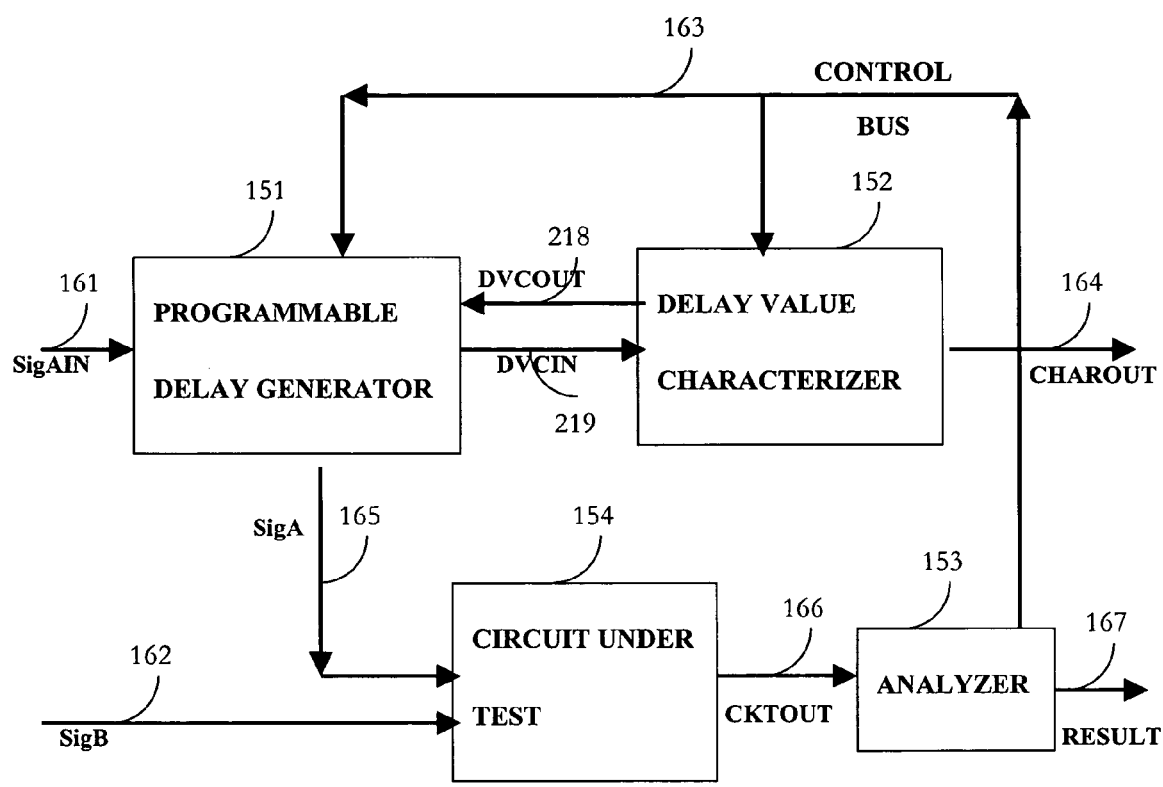
FIG. 2 shows a diagram of an on-chip input timing constraint characterizer.

FIG. 2 shows an on-chip input timing constraint characterizer in accordance with one embodiment of the present invention. This configuration is used for measurement of input timing constraint between two signals for a circuit 154 under test. The characterizer comprises a programmable delay generator 151 and a delay value characterizer 152 connected to one another, and an analyzer 153 that is connected to the programmable delay generator 151 via the circuit 154 that is to be tested. The circuit 154 provides its output to the analyzer 153 which provides an output as a RESULT signal 167.

In the first phase, a first input signal SigAIN 161 is fed into the programmable delay generator 151 which delays SigAIN 161 depending on the value of a control bus 163 to produce a delayed output SigA 165. The signals SigA 165 and SigB 162 are fed into the circuit under test 154. The circuit under test 154 will produce an output CKTOUT 166 depending on its inputs. The analyzer 153 observes the output CKTOUT 166, compares it with expected and reports the RESULT 167 whenever there is a mismatch. This value is used for calculating the input timing constraint between SigA 115 and SigB 112.

In the second phase the analyzer 153 changes the value of the control bus 163 so as to start the self-characterization mode. The delay value characterizer 152 is activated by the control bus 163 and it uses a signal DVCIN 219 and produces a signal DVCOUT 218 to form a delay loop chain along with the programmable delay generator 151 and starts oscillating. The delay value characterizer 152 includes an output that presents an output signal CHAROUT 164 that is observed at a tester output and its frequency is noted down.

It will be appreciated that the programmable delay generator 151 and delay value characterizer 152 can be the same as the programmable delay generator 101 and delay value characterizer 102, respectively, of FIG. 1, or separate circuits could be employed.

The embodiment shown in FIG. 2 can be understood by taking sigA to clock and sigB as data setup for the characterization of circuit 154. Considering SigAIN 151 the same as or shorted with input SigB 162 and starting from a relaxed value of clock delay and decreasing the delay in steps using the programmable delay generator 151, the output of the analyzer 153 will show a wrong output for a particular delay and for delays smaller than the particular delay. The particular delay is the minimum setup time of the circuit under test 154.

The final setup time is calculated using both phases with the formula as explained later. These phases are repeated for each operating condition of temperature and voltage and also for every chip as the delays for each operating condition and for each chip will be different.

Figure 3:
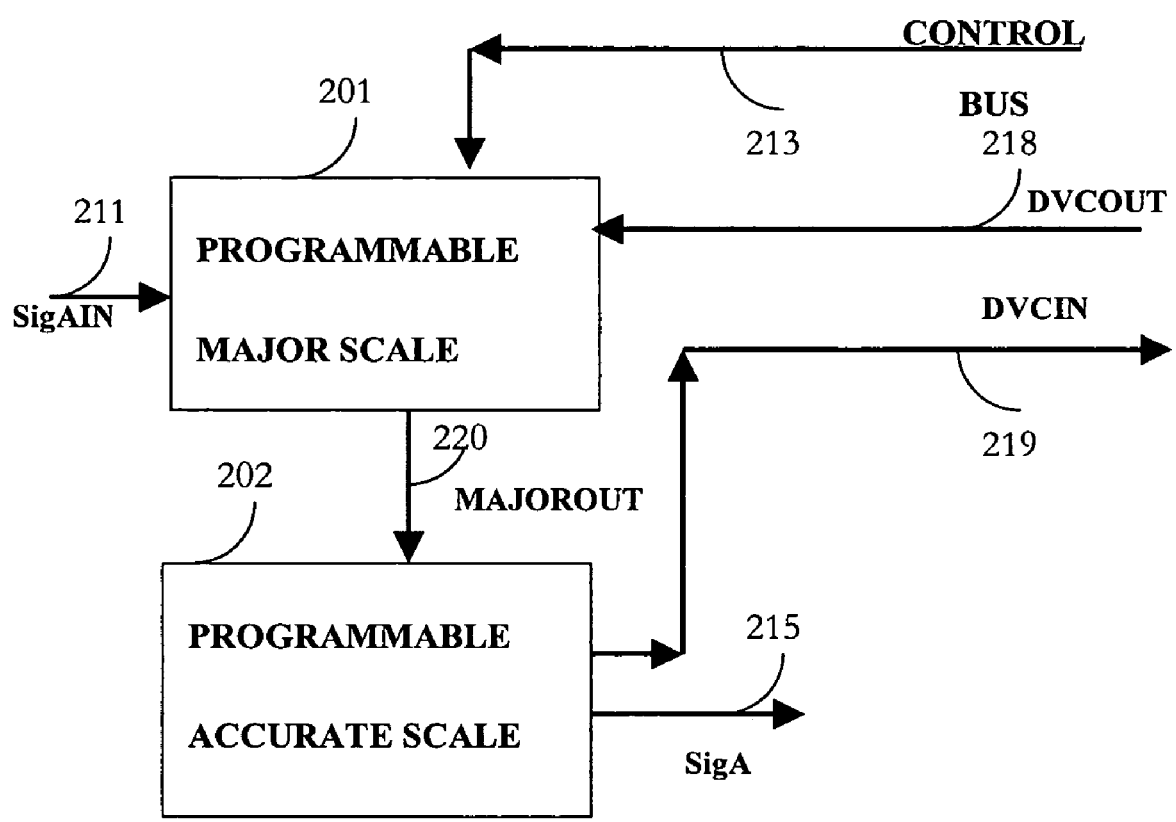
FIG. 3 shows a diagram of a programmable delay generator.

FIG. 3 shows detailed description of the programmable delay generators 101, 151 according to one embodiment. The programmable delay generator 101, 151 has two blocks named programmable major scale 201 and programmable accurate scale 202. The programmable major scale 201 transmits an output signal MAJOROUT 220 to the programmable accurate scale 220 which has a first output that produces DVCIN 219, which is fed to delay value characterizer 152, and the delay value characterizer provides the DVCIN 218. The programmable major scale 201 has a major scale to achieve characterization of time in range of nanoseconds e.g., address setup time of SRAMs or for skews in order of nanoseconds. Each delay of the major scale is equivalent to an integer multiple of delay accurate blocks of the programmable accurate scale 202, but with a constraint that single delay of the major scale is always less than the total delay of programmable accurate scale 202. In terms of mathematical formula this can be represented as follows:

$$DELAYmajor = DELAYaccurate * M < DELAYaccurate * N,$$

where M is the number of DELAYaccurate elements required to produce delay equal to one DELAYmajor element and N is the number of DELAYaccurate elements used in the programmable accurate scale 202.

FIG. 4 shows the detailed diagram of the programmable major scale 201. The programmable major scale comprises of delay elements (DELAYmajor) 250 with each element having delay equal to some integral multiple of DELAYaccurate of THE programmable accurate scale 202. The programmable major scale 201 includes input logic 252 that in one embodiment is simply a 2-input multiplexer which selects INPUT (equal to SigAIN 211 of FIG. 3) in skew characterize mode and DVCOUT in self-characterize mode. The delay of the input logic 252 is a small multiple (1 to 4) of DELAYaccurate for the reasons explained in the discussion of the delay value characterizer 152.

The programmable major scale 201 also includes select logic 204 that functions like a multiplexer with CONTROL acting as its select and can be picked from a standard library. To target the accuracy of the order of picoseconds other circuits also may be used. For example, by using standard cells like tristate inverters or tristate buffers, a multiplexer with almost negligible error can be designed. The large step methodology occupies lesser area because in its absence there will be many small steps and to tap so many multiple nodes many circuits will be needed to perform multiplexing of these many nodes. Also, more area can be saved if, instead of using multiple DELAYaccurate elements to make one DELAYmajor element, a library cell or cells that occupy lesser area can be used. This method will also reduce the number of iterations to characterize the time because algorithms can be written to jump multiple steps. It is very important to note that number of iterations will directly increase the tester time which will result in higher cost and increased cycle time. The programmability helps measuring the time by varying the skew of one signal while keeping other without any skew.

FIG. 5 shows a schematic diagram of the programmable accurate scale 202. The programmable accurate scale 202 is provided to achieve accurate characterization of time in range of picoseconds e.g., setup time of small modules like standard library cells or the measurement of tight timing marginalities between two nodes. The programmable accurate scale comprises delay elements 256 (DELAYaccurate in figure) that can be a library's smallest delay element, for example, an inverter delay can be used or any other delay that is smallest can be used. The number of DELAYaccurate elements 256 used should produce delay greater than the delay produced by single DELAYmajor element 250. The programmable accurate scale also includes select logic 258 that is designed so as to multiplex the various input tapped and also take care that correct transition is available at output (for example every alternate node will have an inverted signal if an inverter is used as the delay element 256). Also the programmable accurate scale 202, when used along with programmable major scale 201, measures large timing values very accurately. This accuracy is very high as compared with conventional off chip methods and also comparable to on-chip methods that use smallest delay elements for skew insertion. The total skew inserted by the programmable accurate scale 202 preferably is greater than the unit delay of the programmable major scale 201. This ensures that entire range between one unit major delay is covered. Mathematically this can be represented as:

$$N*DELAYaccurate > DELAYmajor.$$

The DVCIN is same as the last output of the programmable accurate scale 202 without any delay. The select logic 258 is functioning like a multiplexer with CONTROL acting as select and can be picked from a standard library. But, to target the accuracy of the order of picoseconds, other circuits also may be used. For example by using standard cells like tristate inverters or tristate buffers we can design the multiplexers with almost negligible error. The programmability helps measuring the time by varying the skew of one signal while keeping another signal without any skew.

Operation of Programmable Delay Generator:

The control bus 213 decides the skew between the outputs SigA and SigB and also the control bus decides the mode in which characterizer is in. There can be two modes namely:

Skew Characterize mode: In this mode skew is adjusted between two reference input signals SigA and SigB. The skew will depend on control signals.

Self-characterization mode: In this mode a scale constant is a characterized scale constant and will use a characterized scale constant module for this purpose. The time period of the CHAROUT output 164 will provide the value of this constant.

The advantage of the architecture can be understood by the following formula:

$$DELAYtotal = DELAYmajor*k1 + DELAYaccurate*k2$$
$$= DELAYaccurate*M*k1 + DELAYaccurate*k2,$$

where a unit increase in the value of k1 increases skew by DELAYmajor while a unit increase of k2 increase skew by DELAYaccurate. The k1 and k2 are the number constants and DELAYaccurate will be calculated by the delay value characterizer 152.

Thus, we have gained large range of operation while maintaining the accuracy in picoseconds.

Figure 6:
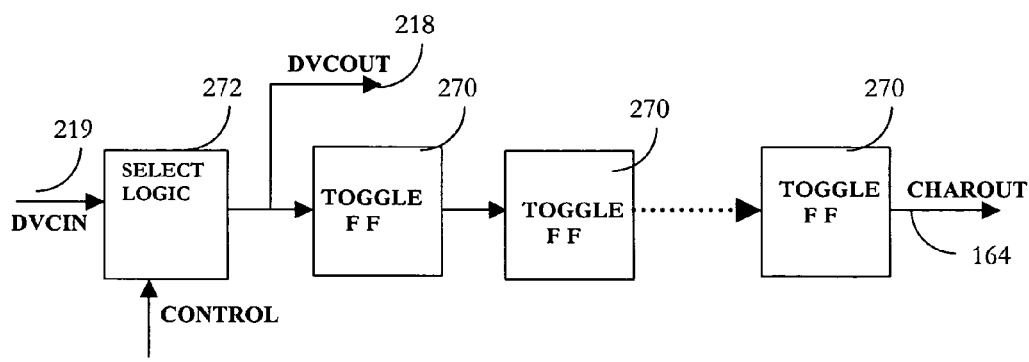
FIG. 6 shows a diagram of a delay value characterizer.

FIG. 6 shows a detailed diagram of the delay value characterizer 152. The delay value characterizer 152 acts a delay chain between the programmable major scale 201 and programmable accurate scale 202 and oscillates at a frequency whose time period will provide a constant used for calculation of total skew or setup time. The delay to be characterized is provided when the delay chain is made to oscillate like ring oscillator. Since the output frequency is small, the power drawn by the chip also be small. The output frequency will be directly proportional to the DELAYaccurate element.

$$Tosc = 2*[\{(M*P)+N\}*DELAYaccurate + selogicDELAY]$$
$$\Rightarrow Fosc = 1/Tosc$$
$$\Rightarrow 1/(2*[\{(M*P)+N\}*DELAYaccurate + selogicDELAY])$$

The delay value characterizer 152 has a plurality of serially connected registering elements (Toggle FF) 270 and serially connected to a select logic 272. The select logic 272 is designed so that its delay is in multiple (between 1 and 4) of DELAYaccurate. The function of the select logic 272 is only to short the signal DVCIN and DVCOUT so that the inverted delay chain is formed containing all DELAYaccurate elements 256. Because of inversion the frequency is observed at CHAROUT 164. The toggle flip-flops 270 are used to provide divided frequency at CHAROUT the tester output because tester output cannot pass high frequencies.

It can be proved that the final calculation will have negligible errors as follows.

Suppose, if the delay chain has a length N with each delay element of delay D and the select logic 272 has delay D'. Now, $$\text{frequency } F=1/[2*(N*D+D')]$$
$$\Rightarrow F=1/[(2*N+k)D], \text{ where delay factor } k=D'/D$$
$$\Rightarrow D=1/[F*(2*N+k)].$$

Suppose, the actual value of the delay factor is k on silicon but with CAD simulations the delay factor was assumed as k' i.e., $$Dcal=1/[F*(2N+k')]$$

whereas, $$Dactual=1/[F*(2N+k)]$$

$$\text{Error } \Delta D=Dactual-Dcal$$

$$\Delta D=[k'-k]/[F*(2N+k)*(2N+k')]=D*[k'-k]/[2N+k'].$$

Now, on analyzing this by using practical values and using D=50 ps,

For, N=100, k=2 and k'=1

$$F=1/(50 \text{ ps}*202)=99.09 \text{ MHz}$$
$$\Rightarrow \Delta D = 50 \text{ ps}*(-1)/202=-0.248 \text{ ps}$$

Thus, the error in calculation of one delay is less than quarter of picosecond i.e., 0.497% (negligible).

For, N=150, k=2 and k'=4
F=66.23 MHz; ΔD=0.33 ps;
Hence, the error in calculation of one delay is 0.66% (still negligible).

For, N=250, k=4 and k'=2
F=39.68 MHz ; ΔD=−0.1992 ps;
Hence, the error in calculation of one delay is 0.39% (very negligible).

For, N=500, k=2 and k'=4
F=19.96 MHz; ΔD=−0.099 ps;
Hence, the error in calculation of one delay is 0.19% (very negligible).

It can be observed in formula given the error is proportional to $1/N^2$, i.e., the error will decrease quadratically with increase of N. Hence, the error in calculation of the value of delay is very-very small for very large values of N.

Also, with large values of N the frequency at the tester output becomes smaller (F is proportional to 1/N) making its measurement easier.

Thus, it can be easily concluded that even if operating conditions i.e., temperature and voltages, are going to vary, the frequency received at the tester output will give a highly accurate value of DELAYaccurate and this value thus can be relied on. It is important to perform a separate characterization for each chip as the operating conditions for a chip affect the time characteristics of the chips.

Figure 7:
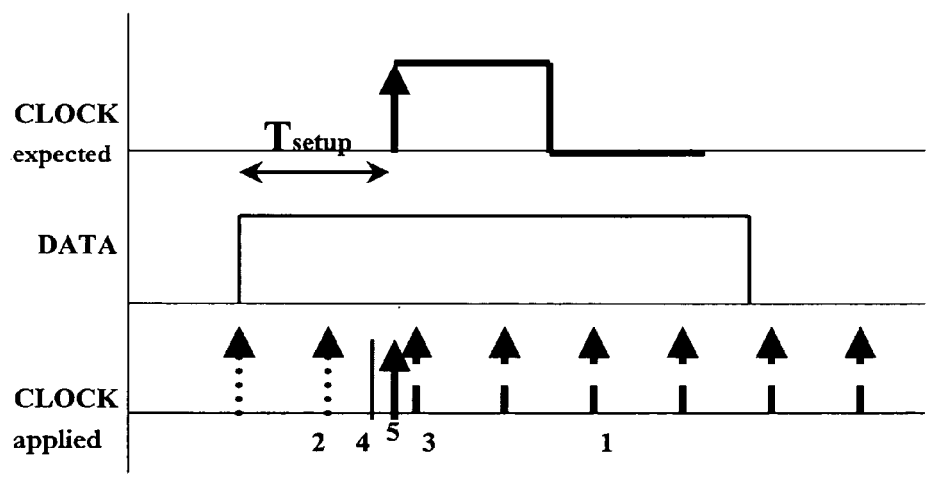
FIG. 7 shows usage of a binary search algorithm with a proposed method.

FIG. 7 shows an example of setup time characterization using a binary search algorithm. The tester time is very valuable and has effect on total cost of a product the optimized algorithm should be used wherever possible. A binary search algorithm uses the time efficiently as it requires only |log$_2$N| steps for N samples of sorted data.

To understand the application of this algorithm to skew variation, a simple example is considered where it is desired to measure data setup time with the positive edge of a clock as reference. In this case 8 major steps are considered with each major delay composed of 4 accurate delays. Thus there are 32 accurate steps in all. Thus, it must take 5 steps at most to characterize timing within this range. This characterization will have an accuracy of one accurate step as discussed before. The first wave shows the expected clock which just meets the data setup time. Assuming, the data edge as reference we try to vary the skew of clock as shown in figure. The dashed edges indicate that setup is relaxed, the dotted edges indicate that setup is violated, and the solid edge indicates the setup is just met (it means that the edge is well within the zone of +/− accuracy where slight variation can cause setup failure). Thus, skew corresponding to the solid edge is the setup time.

Transition Switch: The transition switch can be readily used to control the transitions of the input signals (shown in FIG. 8). It should be inserted in both signal paths (for which characterization is targeted) so as to achieve programmability of transitions also. This circuit will also be useful for input timing constraint characterization where it is desired to characterize timing with respect to various transitions or for a multiple bit bus which has different transitions on each bit. The transition switch module generates an output, which is an inverted or a buffered form of the input that can be fed directly to the block that needs to be characterized. A control bit for each signal controls the type of transition at output. The output can be in form of single bit or multiple bits with different signals on different bits having rising transition or falling transition as desired by user. The transition switch can also be designed using standard library components. This can be very useful in situations where input timing constraint need to be characterized for a bus where multiple bits make transition together.

Figure 8:
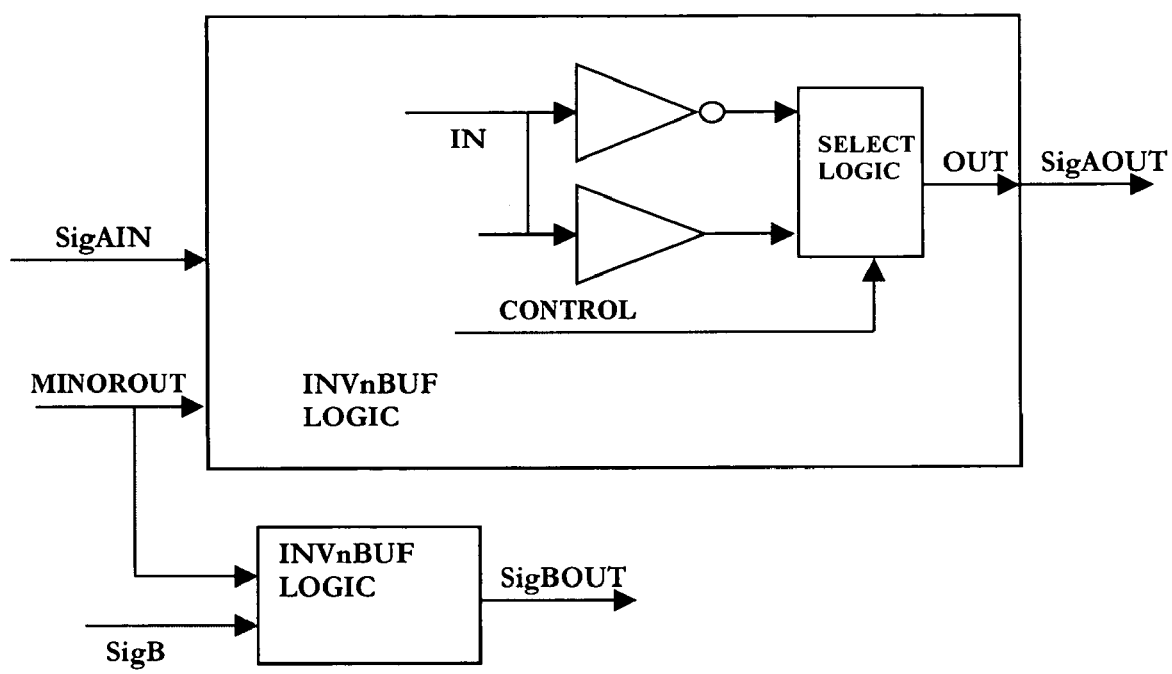
FIG. 8 shows a diagram of a transition switch.

The transition switch according to the embodiment shown in FIG. 8 includes inverter/buffer logic blocks (INVnBUF LOGIC) 280A, 280B that receive the input signals SigAIN and SigB, respectively, and produce respective output signals SigAOUT and SigBOUT. Both logic blocks 280A, 280B are controlled by the MINOROUT control signal. Each logic block 280A, 280B includes an inverter 282 and a buffer 284 having respective inputs coupled to the input signal (SigAIN for block 280A and SigB for block 280B) and respective outputs. Each logic block 280A, 280B also includes a select logic block 286 having first and second signal inputs connected to the respective outputs of the inverter 282 and buffer 284, a control input connected to the MINOROUT control signal, and an output OUT that outputs the output of either the inverter 282 or the buffer 284.

Figure 9:
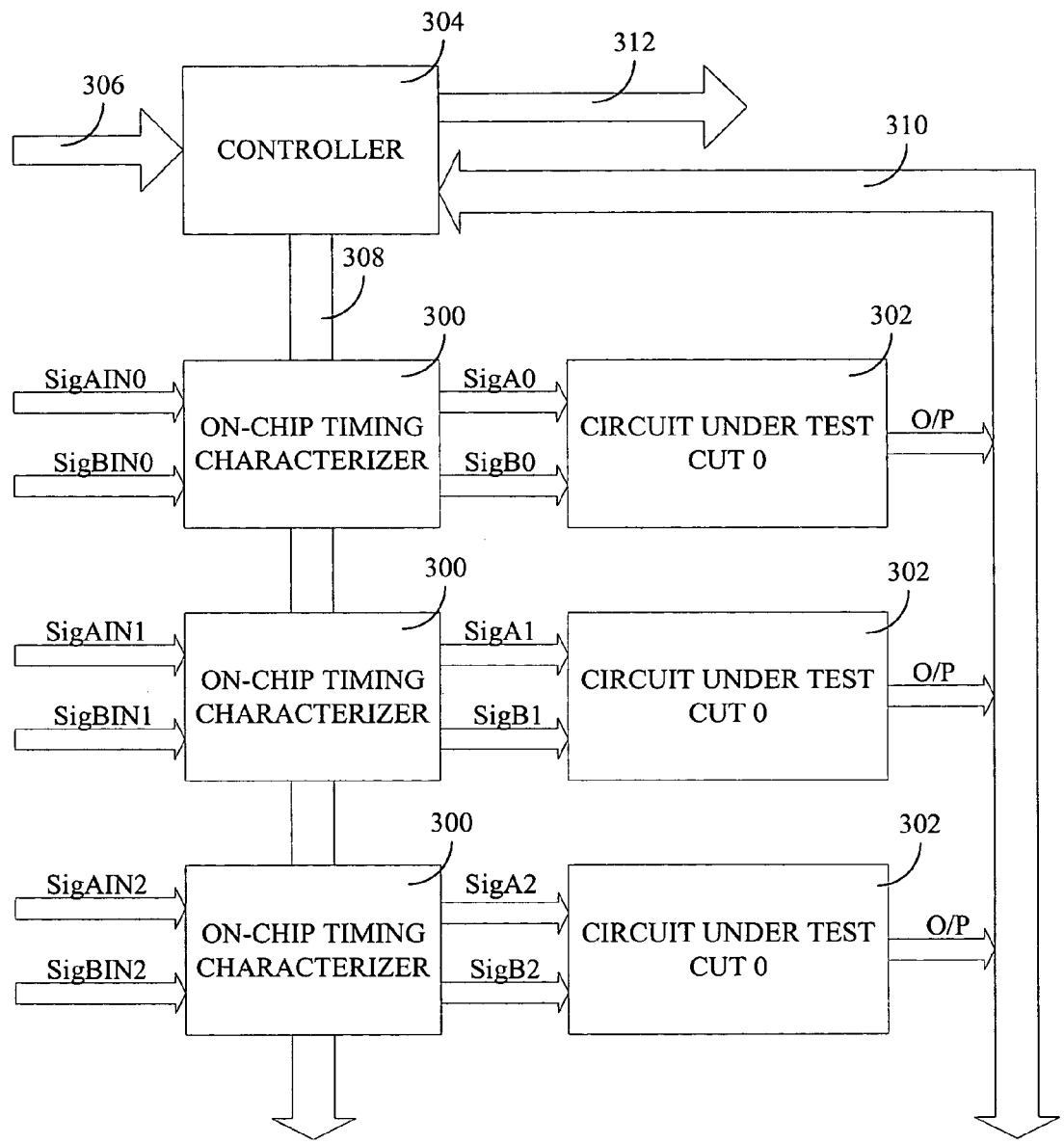
FIG. 9 shows an implementation and interfacing between circuits.

FIG. 9 shows an implementation in which multiple characterizers 300 are used to characterize multiple circuits under test 302. The multiple characterizers 300 can all be controlled by a centralized controller 304. The controller 304 decides the control signals for the circuits 302 depending on requirements received on a controller input bus 306 and send the control signals along a control bus 308 to the corresponding characterizers 300 to cause the characterizers to follow the desired algorithm for the skew insertion. This saves the area as well. The circuits 302 provide their respective outputs to a comparison output bus 310 that is connected to the controller 304. The controller 304 compares the actual output received from the comparison output bus with expected output values and runs on till failure occurs. The controller 304 provides the actual value of time with an accuracy of +/− delay of 1 step to a characterization result bus 312. The controller 304 is synthesized from an RTL in one embodiment and can be placed easily as this block is not timing critical. As shown in the FIG. 9, the controller 304 can control multiple blocks at a time with very small modification in RTL and very small increase in circuit.

ADVANTAGES OF THE PRESENT INVENTION

Various embodiments of the present invention offer the following advantages over the prior art.
On-chip timing characterization at various operating conditions is possible that is independent of tester inaccuracy.
Accuracy is increased by the method proposed.
The time characterized is in the form of digital data.
The timing for multiple bits can also be characterized.
The proposed method can be used for on-chip characterization of skew setup time, hold time, removal time, recovery time.
The proposed method can be used for on-chip skew generation and also for on-chip debugging and testing of timing failures.
The proposed method can be designed by using simple standard library components and therefore has lesser cycle time for development.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. An on-chip timing measurement circuit for improving skew measurement and timing parameter characterization in integrated logic circuits, comprising:
   a programmable delay circuit having a signal input that receives a first input signal and an output that provides a delayed signal that is a delayed version of said first input signal, the output of said programmable delay circuit being connected to a first input of a circuit under test during timing parameter characterization;
   a timing analyzer having a first input connected to the output of the programmable delay circuit during skew measurement; a second input connected to receive a second input signal during the skew measurement, the second input signal being connected to a second input of said circuit under test during the timing parameter characterization; a first output connected to a first control input of said programmable delay generator for controlling a delay value of the programmable delay generator; and a second output providing a result of the skew measurement and/or timing parameter characterization;
   a chip delay element characterization circuit for determining chip specific delay values having one output connected to a second control input of said programmable delay generator and receiving an output from said programmable delay generator for providing a value corresponding to a measured chip specific delay element timing, said characterization circuit being enabled by a control signal from said analyzer during a setup phase.

2. An on-chip timing measurement circuit as claimed in claim 1 wherein said programmable delay circuit comprises:
a major scale delay circuit that includes a chain of delay elements each providing a circuit delay value;
an accurate scale delay circuit that includes a chain of delay elements each providing a fractional unit delay value, the accurate scale delay circuit having an input connected to an output of the major scale delay circuit; and
an output logic circuit connected to an output of the accurate scale delay circuit so as to provide a wide range of delay values and a programmable output signal polarity.

3. An on-chip timing measurement circuit as claimed in claim 1 wherein said delay element characterization circuit comprises a logic circuit for configuring delay elements of the programmable delay generator to form a ring oscillator so as to derive a unit delay value of the circuit under test from an oscillation frequency of the ring oscillator.

4. An on-chip timing measurement circuit as claimed in claim 1 wherein said analyzer is a logic circuit that compares an output of the circuit under test with an expected output during timing parameter characterization whereas the analyzer compares transitions of the input signals during the skew measurement.

5. The on-chip timing measurement circuit of claim 1, wherein one of the inputs of the timing analyzer is connected to an output of the circuit under test during timing parameter characterization.

6. The on-chip timing measurement circuit of claim 5, wherein the timing analyzer compares an output of the circuit under test with an expected output during timing parameter characterization.

7. The on-chip timing measurement circuit of claim 1, wherein the timing analyzer is structured to compare a transition of the first input signal with a transition of the second input signal during skew measurement.

8. The on-chip timing measurement circuit of claim 1, wherein the second output provides the result of the skew measurement and/or timing parameter characterization in digital format.

9. An on-chip method for measuring skew and timing characteristics of integrated circuits providing increased accuracy and range, comprising the steps of:
providing a programmable delay to a first input signal, thereby producing a delayed signal;
connecting said delayed signal to a first input of a circuit under test in a case of timing parameter characterization, whereas connecting the delayed signal to a first input of a timing analyzer in a case of skew measurement;
supplying a second input signal to a second input of said circuit under test in the case of timing parameter characterization whereas supplying said second input signal to a second input of said analyzer in the case of skew measurement; automatically adjusting the programmable delay using a first output of said analyzer;
receiving a result of the skew measurement and/or timing parameter characterization from a second output of said analyzer; and
characterizing chip specific delays by connecting a chain of delay elements that provides the programmable delay as a ring counter and deriving a unit delay value from an oscillation frequency of the ring counter, during a setup phase.

10. An on-chip method for measuring skew and timing characteristics of integrated circuits as claimed in claim 9 wherein said step of providing the programmable delay comprises the steps of:
providing a major scale delay circuit having of a chain of delay elements for delaying the first input signal by a first delay value; and
providing an accurate scale delay circuit having a chain of delay elements for delaying said first input signal by a second delay value, said second delay value being a fractional part of a unit delay value of said first delay value.

11. The method of claim 9 further including comparing an output of the circuit under test with an expected output during timing parameter characterization.

12. The method of claim 9 further including comparing a transition of the first input signal with a transition of the second input signal during skew measurement.

13. The method of claim 9 further including connecting an input of the timing analyzer to an output of the circuit under test during timing parameter characterization.

14. The method of claim 9 further comprising, after receiving the result of the skew measurement from the analyzer, using that result during timing parameter characterization.

15. The method of claim 9 wherein the result of the skew measurement and/or timing parameter characterization is received in digital format.

16. An on-chip timing measurement circuit for improving skew measurement in integrated logic circuits, comprising:
a programmable delay circuit having a signal input that receives a first input signal, a control input, and an output that provides a delayed signal that is a delayed version of said first input signal, and
a skew analyzer having a first input connected to the output of the programmable delay circuit; a second input connected to receive a second input signal; a first output connected to the control input of the programmable delay generator for controlling a delay value of the programmable delay generator, and a second output, the skew analyzer being structured to measure a skew between the delayed signal and the second input signal, iteratively adjust the delay value until the skew is substantially zero, and output a value on the second output that reflects a skew between the first and second input signals.

17. The on-chip timing measurement circuit of claim 16, wherein the programmable delay circuit comprises
a major scale delay circuit that includes a chain of delay elements each providing a circuit delay value;
an accurate scale delay circuit that includes a chain of delay elements each providing a fractional unit delay value, the accurate scale delay circuit having an input connected to an output of the major scale delay circuit; and
an output logic circuit connected to an output of the accurate scale delay circuit so as to provide a wide range of delay values and a programmable output signal polarity.

18. The on-chip timing measurement circuit of claim 17, wherein the circuit delay value provided by each of the delay elements in the chain of delay elements of the major scale delay circuit is less than the total of the fractional unit delay values provided by the chain of delay elements of the accurate scale delay circuit.

19. The on-chip timing measurement circuit of claim 16, further comprising a delay element characterization circuit comprises a logic circuit for configuring delay elements of the programmable delay generator to form a ring oscillator so as to derive a unit delay value of a circuit under test from an oscillation frequency of the ring oscillator.

20. The on-chip timing measurement circuit of claim 16 wherein said analyzer is a logic circuit that compares an output of the circuit under test with an expected output during timing parameter characterization whereas the analyzer compares transitions of the input signals during the skew measurement.

* * * * *